(12) United States Patent
Martin et al.

(10) Patent No.: US 8,723,079 B2
(45) Date of Patent: May 13, 2014

(54) LASER SOLDERING USING THERMAL CHARACTERISTICS

(75) Inventors: Gerard-Marie Martin, Paris (FR); Jean-Michel Morelle, Beaugency (FR); Laurent Vivet, Bois d'Arcy (FR)

(73) Assignee: Valeo Etudes Electroniques, Creteil (FR)

( * ) Notice: Subject to any disclaimer, the term of this patent is extended or adjusted under 35 U.S.C. 154(b) by 1104 days.

(21) Appl. No.: 12/087,460

(22) PCT Filed: Jan. 9, 2007

(86) PCT No.: PCT/FR2007/050632
§ 371 (c)(1),
(2), (4) Date: Sep. 22, 2008

(87) PCT Pub. No.: WO2007/080350
PCT Pub. Date: Jul. 19, 2007

(65) Prior Publication Data
US 2009/0039525 A1  Feb. 12, 2009

(30) Foreign Application Priority Data
Jan. 10, 2006  (FR) ..................................... 06 00205

(51) Int. Cl.
*B23K 1/005*  (2006.01)
(52) U.S. Cl.
CPC ........... *B23K 1/0056* (2013.01); *B23K 2201/40* (2013.01)
USPC .................................. 219/121.85; 219/85.13
(58) Field of Classification Search
CPC ... B23K 1/005; B23K 1/0056; B23K 2201/40
USPC ............... 219/121.6, 121.83, 121.85, 121.63, 219/121.64, 121.62, 121.65, 121.66, 85.12, 219/85.13; 228/179.1, 180.1, 180.2
See application file for complete search history.

(56) References Cited

U.S. PATENT DOCUMENTS

| 4,278,867 A | * | 7/1981 | Tan ......................... 219/121.64 |
| 4,696,101 A | * | 9/1987 | Vanzetti et al. ................. 29/740 |

(Continued)

FOREIGN PATENT DOCUMENTS

| DE | 4005-314 A1 | * | 8/1991 |
| DE | 100 15 938 A1 | | 10/2001 |

(Continued)

OTHER PUBLICATIONS

Wesling et al., "TAB Inner-Lead Bond Process Characterization for Single Point Laser Bonding", Mar. 1994, IEEE Transactions on Component Packaging and Manufacturing Technology—PArt A, vol. 17, No. 1, pp. 142-148.*

(Continued)

*Primary Examiner* — Geoffrey S Evans
(74) *Attorney, Agent, or Firm* — Oliff PLC

(57) ABSTRACT

In this soldering method, a laser is directed onto an end face of the stack in such a manner that the laser heats the stack. At least one parameter of the laser is adjusted to a value that is the image by a mathematical model of at least one thermal characteristic of the stack. The parameter of the laser is a parameter selected from an irradiation duration, a surface area of the end face of the stack that is irradiated by the laser, and an irradiating power of the laser.

13 Claims, 2 Drawing Sheets

(56) References Cited

U.S. PATENT DOCUMENTS

| | | | |
|---|---|---|---|
| 5,055,652 A * | 10/1991 | Jones et al. | 219/121.64 |
| 5,122,635 A * | 6/1992 | Knodler et al. | 219/121.63 |
| 5,509,597 A * | 4/1996 | Laferriere | 219/121.62 |
| 5,580,471 A * | 12/1996 | Fukumoto et al. | 219/121.63 |
| 5,705,788 A * | 1/1998 | Beyer et al. | 219/121.62 |
| 5,861,666 A * | 1/1999 | Bellaar | 257/686 |
| 6,278,078 B1 * | 8/2001 | Walvoord et al. | 219/121.85 |
| 6,310,775 B1 | 10/2001 | Nagatomo et al. | |
| 6,313,522 B1 * | 11/2001 | Akram et al. | 257/686 |
| 6,353,202 B1 * | 3/2002 | Grotsch et al. | 219/121.63 |
| 6,394,158 B1 | 5/2002 | Momeni | |
| 6,448,506 B1 * | 9/2002 | Glenn et al. | 257/686 |
| 7,067,926 B2 | 6/2006 | Yamazaki et al. | |
| 7,816,155 B2 * | 10/2010 | Wong et al. | 438/20 |
| 2002/0163786 A1 * | 11/2002 | Moshayedi | 361/735 |
| 2004/0140547 A1 | 7/2004 | Yamazaki et al. | |
| 2005/0224767 A1 * | 10/2005 | Japp et al. | 252/570 |
| 2005/0266610 A1 * | 12/2005 | Akram et al. | 438/107 |
| 2006/0033118 A1 * | 2/2006 | Lee et al. | 257/100 |
| 2006/0060636 A1 * | 3/2006 | Daves et al. | 228/180.22 |
| 2008/0006924 A1 * | 1/2008 | Morita | 257/686 |

FOREIGN PATENT DOCUMENTS

| | | | |
|---|---|---|---|
| DE | 10064487 A1 * | 7/2002 | |
| EP | 1 432 032 A3 | 5/2013 | |
| FR | 2 802 764 | 6/2001 | |
| JP | 60-145264 A * | 7/1985 | |
| JP | 63-165095 A | 7/1988 | |
| JP | 3-161163 A * | 7/1991 | |
| JP | 5-55740 A * | 3/1993 | |
| JP | 6-196852 A * | 7/1994 | |
| JP | 09-216051 A | 8/1997 | |
| JP | A-2000-183079 | 6/2000 | |
| JP | A-2000-269407 | 9/2000 | |
| JP | 2001-148451 A | 5/2001 | |
| JP | A-2001-523585 | 11/2001 | |
| JP | A-2004-006670 | 1/2004 | |
| JP | A-2004-200522 | 7/2004 | |
| JP | A-2004-228485 | 8/2004 | |
| WO | WO 99/267523 | 6/1999 | |
| WO | WO-2006/082633 A1 * | 10/2006 | |

OTHER PUBLICATIONS

Flanagan et al., "Laser Soldering and Inspection of Fine Pitch Electronic Components", Dec. 1996, Elsevier, Journal of Materials Processing Technology, vol. 56, pp. 531-541.*

Varis et al., "Thermal Inspection of Solder Quality of Electronic Components", Apr. 1999, SPIE vol. 3700, pp. 93-98.*

Beckett et al., "The finite element modeling of Laser Soldering for Electronic Assemblies", Dec. 2002, International Journal of Numerical Modeling: Electronic Networks, Devices and Fields, vol. 15, pp. 265-281.*

Goos et al., "D-Optimal Response Surface Designs in the Presence of Random Block Effects",Jan. 2001, Elsevier, Computational Statistics & Data Analysis, vol. 37, pp. 433-453.*

Naveed et al., "Diode-Laser Soldering—A Lumped Parameter Mathematical Model and Comparison of Different Optical Soldering Technologies", Dec. 2003, Proceedings of SPIE, vol. 4973, pp. 142-157.*

Gilbert, "Closed Loop Control of Laser Soldering Through Optical and Thermal Imaging", Jun. 2008, 2nd Electronics System Integration Technology Conference, Greenwich , UK, pp. 1333-1338.*

Machine translation of DE 10064487, Feb. 2012.*

Machine translation of DE 4005314, Feb. 2012.*

Brandner et al., "Soldering with solid state and diode lasers; Energy coupling, temperature rise, process window," *Journal of Laser Applications*, vol. 12, No. 5, pp. 194-199, Oct. 2000.

Jul. 31, 2012 Office Action issued in Japanese Patent Application No. 2008-549051 (with translation).

Office Action in Japanese Application No. 2008-549051 mailed Aug. 6, 2013 (with English Translation).

* cited by examiner

LASER SOLDERING USING THERMAL CHARACTERISTICS

FIELD OF THE INVENTION

The present invention relates to a method of soldering together at least two stacked elements, to a method of preparing a mathematical model for implementing the soldering method, and to an electronic module.

The invention applies more particularly to soldering an electronic module comprising a support-forming first element, e.g. a printed circuit, having stacked thereon at least second and third elements that form electronic members, the three elements being soldered together.

BACKGROUND OF THE INVENTION

Stacking the electronic members on the support makes it possible to obtain an electronic module that is relatively compact.

A method is already known in the state of the art for soldering together at least two stacked elements forming a stack, the method being of the type in which a laser is directed onto an end face of the stack so that the laser heats the stack, and at least one parameter of the laser is adjusted.

As a general rule, and the laser parameter is a parameter selected from an irradiation duration, a surface area of the end face of the stack that is irradiated by the laser, and an irradiation power of the laser.

By way of example, the stack comprises a support constituting a printed circuit (first element of the stack) and a semiconductor chip (second element of the stack). A solder-forming mass is interposed between these two elements.

The stack is characterized by certain thermal features, in particular the critical temperature of the semiconductor chip above which the chip is destroyed, and the melting temperature of the solder, which temperature must be lower than the critical temperature of the semiconductor chip.

In general, each parameter of the laser is adjusted in empirical manner to a value such that: firstly a maximum temperature reached by the stack does not exceed the critical temperature of the semiconductor chip; and secondly the maximum temperature reached by the stack is greater than the melting temperature of the solder-forming mass.

Thus, for a stack comprising only two elements, the value for each parameter of the laser can be adjusted empirically because the number of thermal characteristics of the stack that need to be taken into account is limited.

However, the number of thermal characteristics that need to be taken into account increases with the number of elements in the stack.

Consequently, when the stack comprises at least three elements, an empirical adjustment of the parameter value is unlikely to take account of all of the thermal characteristics of the stack, and can lead to the soldering between two of the elements of the stack being of relatively poor quality, or else to one of the elements in the stack being damaged.

OBJECT AND SUMMARY OF THE INVENTION

An object to the invention is to provide a method of soldering together at least two stacked elements, in which method the value of the laser parameter is adjusted in relatively fast and accurate manner, regardless of the number of elements in the stack.

To this end, the invention provides a soldering method of the above-specified type, wherein the parameter is adjusted to a value that is the image of at least one thermal characteristic of the stack as obtained by means of a mathematical model.

It is thus advantageously possible to determine quickly and accurately the value for the laser parameter by means of the mathematical model.

The mathematical model may be implemented in the form of a computer program that provides an adjustment value for the laser parameter, which value is accurate and appropriate, in contrast to conventional empirical methods.

The soldering method of the invention may further comprise the following characteristics:

the laser parameter is a parameter selected from an irradiation duration, a surface area of the end face of the stack that is irradiated by the laser, and an irradiation power of the laser; and the thermal characteristic of the stack is selected from a critical temperature for damaging an element of the stack, a melting temperature of a solder-forming mass interposed between two elements of the stack, and a temperature of a synthetic material bordering one of the elements of the stack.

The invention also provides a method of preparing a mathematical model for implementing the soldering method of the invention, comprising the following steps, in compliance with an experimental design:

adjusting the value of the parameter of the laser;

measuring temperatures over a zone of at least one sample of at least a portion of the stack during a duration in which a first end face of the sample is irradiated by the laser; and selecting at least one remarkable temperature from the measured temperatures; and also including a step of defining a mathematical model in such a manner that a vector having the value of the laser parameter as a coordinate is the image as obtained by means of the mathematical model of a vector having at least the remarkable temperature as a coordinate.

A method of the invention for preparing a mathematical model may further comprise the following characteristics:

the mathematical model includes at least one mathematical function of polynomial type;

the zone extends over a second end face of the sample and the remarkable temperatures are maximum temperatures measured in a remarkable sub-zone of said zone;

the remarkable sub-zone separates a portion of the zone that is to be covered in a solder-forming mass from another portion of the zone that is not to be covered by the solder-forming mass;

the sub-zone is the laser-irradiated surface area as projected onto the second end face of the sample;

an element of the sample comprises a metal portion bordered by a portion made of synthetic material, and the remarkable zone separates the metal portion from the portion made of synthetic material;

prior to the step of measuring temperatures, the zone of the sample is blackened;

the temperatures are measured by processing an infrared image of the zone of the sample;

the experimental design is a design of type selected from: a Box Behnken design; a composite central design; and a D-optimal design; and the mathematical model is determined from a method of analyzing the variance of the remarkable temperatures.

The invention also provides an electronic module comprising a support-forming first element having stacked thereon at least second and third elements forming electronic members, the three elements being soldered together, wherein the three elements are soldered together by irradiating the electronic module by means of a laser.

BRIEF DESCRIPTION OF THE DRAWING

The invention can be better understood on reading the following description given purely by way of example and made with reference to the drawings, in which.

MORE DETAILED DESCRIPTION

Figure 1:
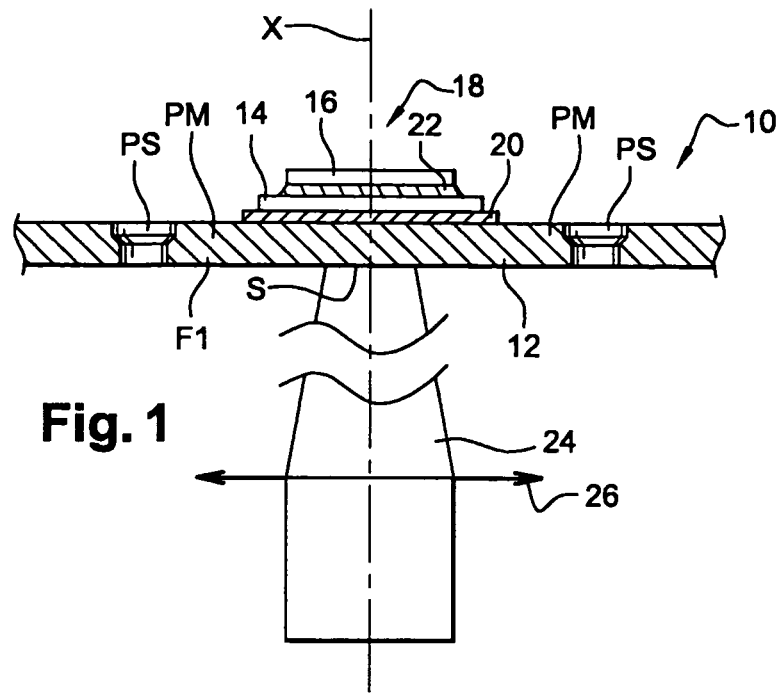
FIG. 1 is a diagrammatic view of an electronic module of the invention.

FIG. 1 shows an electronic module of the invention. The electronic module is given overall reference 10.

The electronic module 10 includes a first element 12. In the example described, the first element 12 forms a support.

In the example shown, the support 12 has a metal portion PM partially surrounded by a portion PS made of synthetic material (plastics material). Advantageously, the support 12 is a printed circuit substrate.

In a variant, the support 12 may be made of a ceramic material.

The electronic module 10 also includes second and third elements 14 and 16 that are stacked along a vertical axis X on the metal portion PM of the support 12 in such a manner that the three elements 12, 14, and 16 form a stack 18.

By way of example, the second and third elements 14 and 16 constitute electronic members of the semiconductor chip type.

The elements of the stack 18 are soldered to one another in application of a soldering method of the invention by irradiating the electronic module 10 with a laser 24.

Thus, in the example shown, first and second solder-forming masses 20 and 22 are interposed respectively between the support 12 and the chip 14, and between the chip 14 and the chip 16.

In conventional manner, the solder-forming masses 20 and 22 are masses of paste or masses cut from a tape, and they are placed between the elements 12 to 16 of the stack 18 prior to soldering them together.

In a variant, the solder-forming masses may be formed by coatings on the chips 14 and 16, which coatings are secured to the chips prior to soldering, the material of the coatings possibly then being silver, gold, tin, etc.

The heat that serves to melt the solder-forming masses 20 and 22 in order to solder together the three elements is generated by irradiating the electronic module 10 with a laser 14 that is emitted from a laser source (not shown).

By way of example, the laser source may comprise a laser diode emitting a laser beam, in particular of the infrared type.

The laser 24 is directed to an end face F1 of the stack 18 in such a manner as to heat the stack 18. More particularly, the laser 24 is focused by means 26 for focusing the laser 24 on the surface area S of the metal portion PM of the support 12 that is to be irradiated by the laser 24.

In order to heat the stack 18 sufficiently to melt the solder masses 20 and 22 without damaging any of the three elements in the stack 18, the laser 24 is provided with adjustment means (not shown) for adjusting the value of at least one parameter of the laser 24.

In the example described, the parameters of the laser 24 are an irradiation duration D, the surface area S irradiated by the laser 24 on the end face F1, and an irradiation power P of the laser 24.

The values of the parameters D, S, and P of the laser 24 are adjusted in such a manner as to take account of the thermal characteristics of the stack 18, in particular the melting temperatures of the solder masses 20 and 22, the critical temperatures of the three elements in the stack 18 (since an element that is heated above is critical temperature is destroyed), and also the melting temperature of the synthetic material bordering the support 12.

For example, the melting temperatures of the solder-forming masses are about 300° C., and the critical temperatures of the three elements in the stack 18 are of the order of 500° C.

In the soldering method of the invention, each parameter of the laser 24 is adjusted to a value that is the image obtained by means of a mathematical model M of at least one thermal characteristic of the stack 18.

Figure 2:
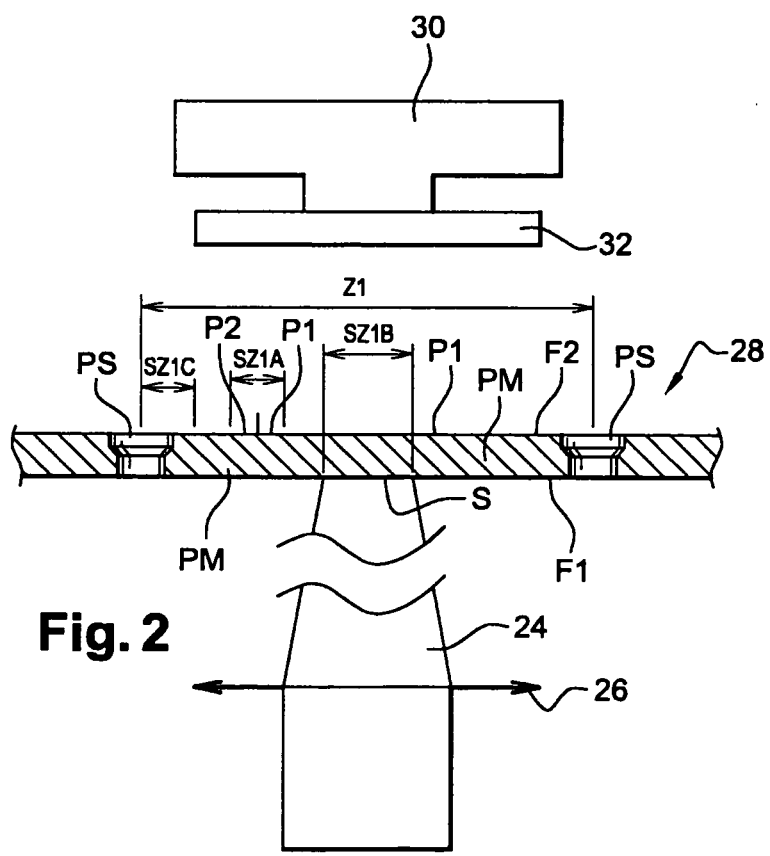
FIGS. 2 to 4 are diagrammatic views of samples of the FIG. 1 electronic module at different stages in a method of making a mathematical model for implementing a soldering method of the invention.
Figure 3:
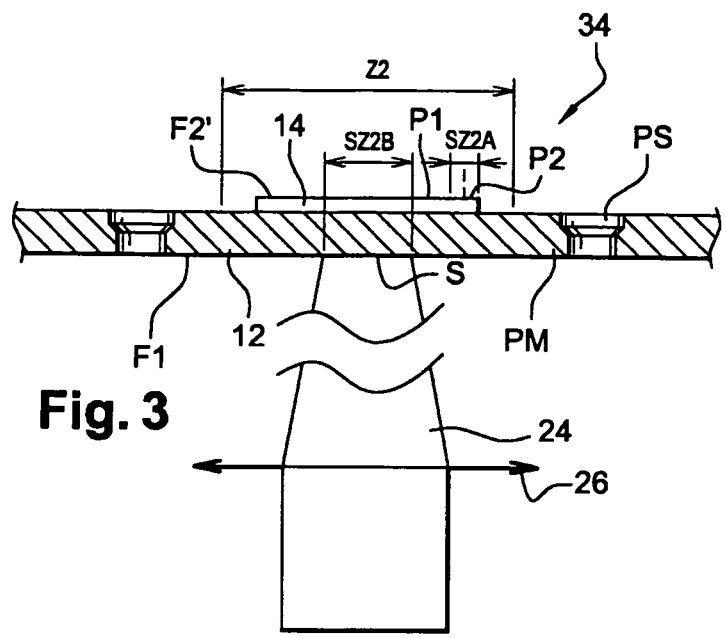
Figure 4:
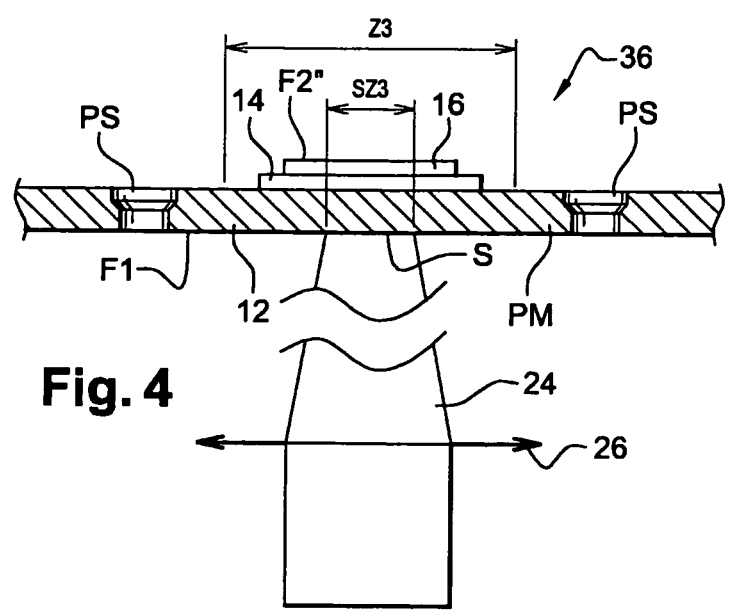

With reference to FIGS. 2 to 4, there follows a description of a method of making the mathematical model M of the invention.

In order to make the mathematical model M, the following steps are performed, in compliance with an experimental design.

In known manner, an experimental design serves to define some number N of experiments to be performed in order to obtain a mathematical model that is sufficiently accurate, and also to define for each experiment the values of the parameters that are to be adjusted.

For example, the experimental design can be a design of the type selected from a Box Behnken design, a composite central design, and a D-optimal design. It is also possible to use other conventional experimental designs.

Thus, in the example described, the experimental design defines a set E of parameter values for the laser 24 comprising:

a number $N_D$ of values $D_i$ for the duration D of the laser irradiation, the values lying between a minimum value $D_{min}$ and a maximum value $D_{max}$, e.g. lying in the range 200 milliseconds (ms) to 700 ms;

a number NP of values $P_i$ for the power P of the irradiation lying between a minimum value $P_{min}$ and a maximum value $P_{max}$, for example lying in the range 700 watts (W) to 2000 W; and a number NS of values $S_i$ for the irradiated surface area S lying between a minimum value $S_{min}$ and a maximum value $S_{max}$.

Thus, the experimental design defines the number N of experiments to be performed, these N experiments being selected, for example, from amongst the possible combinations of the various values for the laser parameters, for example $N=N_D \times N_P \times N_S$ for a so-called "complete" experimental design, or $N<N_D \times N_P \times N_S$ for a so-called "fractional" experimental design, in particular of the Box Behnken, central composite, or D-optimal type.

As a result, and for each experiment of the experimental design, the parameters D, S, and P of the laser are adjusted to respective values $D_i$, $S_i$, and $P_i$ lying within the set E defined by the experimental design.

In a first stage, a first sample 28 is formed of a portion of the stack 18 (FIG. 2). It can be seen in FIG. 2 that the first sample 28 comprises only the first element of the stack 18, i.e. the support 12.

The first sample 28 has a first end face F1 corresponding to the bottom face of the support 12, and a second end face F2 corresponding to the top face of the support 12.

The N experiments defined in the experimental design are then performed on the first sample 28.

For each experiment, the parameters D, S, and P of the laser 24 are adjusted respectively to the values $D_i$, $S_i$, and $P_i$ of the set E. A "parameter" vector $VP_i$ is then defined having as its first, second, and third coordinates the respective values $D_i$, $S_i$, and $P_i$ of the three parameters D, S, and P of the laser 24.

The laser 24 is directed onto the first end face F1 for a duration D (set to the value $D_i$) for irradiating said face F1 by the laser 24 so that the laser 24 heats the first sample 28.

During a first step, temperatures are then measured on a zone Z1 of the first sample 28.

In the example shown, the zone Z1 extends over the second end face F2 opposite to the first end face F1 of the first sample 28.

The temperatures are preferably measured by processing an infrared image of the zone Z1 of the sample 28.

The infrared image is obtained by conventional infrared image acquisition means, e.g. comprising an infrared camera 30.

By way of example, the camera 30 is provided with a lens 32 having a large field angle adapted to the size of the zone Z1, and with sufficient magnification to obtain good resolution of the pertinent elements in the zone Z1.

Furthermore, the camera 30 makes it possible, for example, to acquire images at a frequency of about 50 hertz (Hz). Thus, for a duration D for irradiating the first sample 28 by means of the laser 28 having a value $D_i$=500 ms, it is possible to obtain 25 images of the zone Z1.

Preferably, before measuring the temperatures in the zone Z1 of the first sample 28, the zone Z1 is blackened (e.g. by being covered in a black coating (paint, etc)) so as to form a "back body".

During a second step, remarkable temperatures are selected from the temperatures measured.

Preferably, the remarkable temperatures are three maximum temperatures measured respectively in three remarkable sub-zones SZ1A, SZ1B, SZ1C of the zone Z1 of the first sample 28.

The distribution of temperatures in the first sample 28 is not uniform, and the highest temperatures are close to the surface area S of the stack 18 that is being irradiated by the laser 24.

The first remarkable sub-zone SZ1A separates a portion P1 of the zone Z1 that is to be covered by the solder mass 20 from another portion P2 of the zone Z1 that is not to be covered by the solder mass 20.

The second remarkable sub-zone SZ1B is the laser-irradiated surface area S as projected onto the second end face F2 of the first sample 28.

The third remarkable sub-zone SZ1C separates the metal portion PM from the portion PS made of synthetic material.

For each experiment, three first coordinates of a "temperature" vector $VT_i$ are defined as being of the three maximum temperatures respectively of the sub-zones SZ1A, SZ1B, and SZ1C corresponding to the settings of the parameters of the laser to the values $D_i$, $S_i$, and $P_i$ of the "parameter" vector $VP_i$.

In a second stage, a second sample 34 is formed of a portion of the stack 18 (FIG. 3). In FIG. 3 it can be seen that the second sample 34 comprises only the first two elements of the stack 18, namely the support 12 and the chip 14.

In the second sample 34, the second end face F2' corresponds to the top face of the chip 14.

In a manner analogous to the first sample 28, the N experiments defined by the experimental design are performed on the second sample 34.

Thus, for each experiment, the parameters D, S, and P of the laser 24 are adjusted to the values $D_i$, $S_i$, and $P_i$ of the set E, and a "parameter" vector $VP_i$ is defined having as its first, second, and third coordinates the respective values $D_i$, $S_i$, and $P_i$ of the three parameters D, S, and P of the laser.

During a first step, temperatures are measured over a zone Z2 of the second sample 34 for a duration D during which the first face F1 of the second sample 34 is irradiated by the laser 24.

The zone Z2 extends over the second end face F2' of the second sample 34.

Preferably, before measuring the temperatures over the zone Z2 of the second sample 34, the zone Z2 is blackened so as to form a "black body".

Thereafter, during a second step, remarkable temperatures are selected from the temperatures measured in the zone Z2.

The remarkable temperatures are preferably the two maximum temperatures measured respectively in two remarkable sub-zones SZ2A, SZ2B of the zone Z2.

The first remarkable sub-zone SZ2A separates a portion P1 of the zone Z2 that is to be covered by the solder mass 22 from another portion P2 of the zone Z2 that is not to be covered by the solder mass 22.

The second remarkable sub-zone SZ2B is the laser-irradiated surface area S as projected onto the second end face F2' of the second sample 34.

For each experiment, fourth and fifth coordinates are defined for the "temperature" vector $VT_i$ as being the maximum temperatures respectively in the sub-zones SZ2A and SZ2B corresponding to the settings of the laser parameters on the values $D_i$, $S_i$, and $P_i$ of the "parameter" vector $VP_i$.

Optionally, in a third stage, a third sample 36 is formed of a portion of the stack 18 (FIG. 4). As can be seen in FIG. 4, the third sample 36 comprises all three elements of the stack 18, namely the support 12 and the two semiconductor chips 14 and 16.

In the third sample 36, the second end face F2" corresponds to the top face of the chip 16.

In a manner analogous to that used for the first and second samples 28 and 34, the N experiments defined by the experimental design are performed on this third sample 36.

Thus, for each experiment, the parameters D, S, and P of the laser 24 are adjusted to the values $D_i$, $S_i$, and $P_i$ of the set E, and a "parameter" vector $VP_i$ is defined having as its first, second, and third coordinates respective values $D_i$, $S_i$, and $P_i$ or the three parameters D, S, and P of the laser.

During a first step, temperatures are measured over a zone Z3 of the third sample 36 during a duration D in which the first face F1 of the third sample 36 is irradiated by the laser 24.

Preferably, before measuring the temperatures over the zone Z3 of the third sample 36, the zone Z3 is blackened so as to form a "black body".

During a second step, a remarkable temperature is elected from the temperatures measured in the zone Z3. The remarkable temperature is preferably a maximum temperature measured in a sixth remarkable sub-zone SZ3 constituted by the laser-irradiated surface area S as projected onto the second end face F2" of the third sample 36.

For each experiment, a sixth coordinate of the "temperature" vector $VT_i$ is defined as being the sixth maximum temperature coordinate selected from the sixth sub-zone SZ6, corresponding to a setting of the parameters of the laser on the values $D_i$, $S_i$, and $P_i$ of the "parameter" vector $VP_i$.

Once the N experiments have been performed on each of the three samples 28, 34, and 36, N "parameter" vectors $VP_i$ are obtained, as are N corresponding "temperature" vectors $VT_i$.

A mathematical model M is then defined in such a manner that each "parameter" vector $VP_i$ of the laser 24 is the image of each corresponding "temperature" vector $VT_i$ as obtained by implementing the model M.

In this example, the mathematical model M is defined from a method of analyzing the variance in the remarkable temperatures, and it preferably includes at least one mathematical function of polynomial type.

Thus, in order to solder together the three elements 12, 14, and 16 of the stack 18, the procedure is as follows.

A "temperature" vector $VT_i$ is defined that, in the example described, has the following first to sixth coordinates:
- a temperature greater than or equal to the melting temperature of the solder mass 20;
- a temperature strictly less than the critical temperature of the support 12;
- a temperature strictly less than the melting temperature of the synthetic material bordering the metal portion PM of the support 12;
- a temperature greater than or equal to the melting temperature of the solder mass 22;
- a temperature strictly less than the critical temperature of the chip 14; and
- a temperature strictly less than the critical temperature of the chip 16.

Thereafter, the coordinates of this vector $VT_i$ are input into a computer that implements the mathematical model M so as to obtain at least one image of this "temperature" vector $VT_i$ by means of the mathematical model M (which model M may optionally produce a plurality of images of the vector $VT_i$). This image constitutes a "parameter" vector $VP_i$ having as its coordinates the values $D_i$, $S_i$, and $P_i$ that are appropriate for soldering the stack 18.

Finally, and the parameters D, S, and P of the laser 24 are adjusted to the values $D_i$, $S_i$, and $P_i$, thereby obtaining, in a single operation, appropriate soldering of the electronic module 10 as shown in FIG. 1.

The electronic module 10 of the invention, as obtained by laser soldering, differs from an electronic module obtained by a conventional soldering method (reflow oven, etc) in the appearance of its solder-forming masses.

Laser soldering gives rise to intense heating of relatively short duration followed by relatively fast cooling. As a result, the material in which the solder masses are made forms fine dendrites while solidifying.

What is claimed is:

1. A soldering method comprising:
   soldering together, in a single soldering step, at least three stacked elements forming a stack, in which a laser is directed onto an end face of the stack so that the laser heats the stack, and at least one parameter of the laser is adjusted, wherein:
   the stack comprises:
      a support,
      a first chip,
      a second chip,
      a first solder-forming mass, and
      a second solder-forming mass, the first solder-forming mass and the second solder-forming mass being interposed between the support and the first chip and between the first chip and the second chip, respectively,
   the parameter is adjusted to a value to take account of at least one thermal characteristic of the stack by using a mathematical model, and
   the thermal characteristic of the stack is selected from one of: a critical temperature for damaging an element of the stack, a melting temperature of one of the first solder-forming mass and the second solder-forming mass interposed between two elements of the stack, and a temperature of a synthetic material bordering one of the elements of the stack; and
   preparing a mathematical model for implementation of the soldering method in compliance with an experimental design.

2. A soldering method according to claim 1, in which the laser parameter is a parameter selected from an irradiation duration, a surface area of the end face of the stack that is irradiated by the laser, and an irradiation power of the laser.

3. A soldering method according to claim 1, in which the thermal characteristic of the stack is selected from a critical temperature for damaging an element of the stack, a melting temperature of a solder-forming mass interposed between two elements of the stack, and a temperature of a synthetic material bordering one of the elements of the stack.

4. A soldering method according to claim 1, wherein the step of preparing the mathematical model for implementation further comprises the following steps, in compliance with the experimental design:
   adjusting the value of the parameter of the laser;
   measuring temperatures over a zone of at least one sample of at least a portion of the stack during a duration in which a first end face of the sample is irradiated by the laser; and
   selecting at least one maximum temperature from the measured temperatures; and also including a step of defining a mathematical model in such a manner that a vector having the value of the laser parameter as a coordinate is the image as obtained by means of the mathematical model of a vector having at least the maximum temperature as a coordinate.

5. A soldering method according to claim 4, in which the mathematical model includes at least one mathematical function that comprises a polynomial.

6. A soldering method according to claim 4, in which, prior to the step of measuring temperatures, the zone of the sample is blackened.

7. A soldering method according to claim 4, in which the temperatures are measured by processing an infrared image of the zone of the sample.

8. A soldering method according to claim 4, in which the experimental design is a design selected from one of a Box Behnken design; a composite central design; and a D-optimal design.

9. A soldering method according to claim 4, in which the mathematical model is determined from a method of analyzing the variance of the at least one maximum temperature.

10. A soldering method according to claim 4, in which the zone extends over a second end face of the sample and the at least one maximum temperature is a maximum temperature measured in a sub-zone of the zone.

11. A soldering method according to claim 10, in which the sub-zone separates a portion of the zone that is to be covered in a solder-forming mass from another portion of the zone that is not to be covered by the solder-forming mass.

12. A soldering method according to claim 10, in which the sub-zone is the laser-irradiated surface area as projected onto the second end face of the sample.

13. A soldering method according to claim 10, in which an element of the sample comprises a metal portion bordered by a portion made of synthetic material, and the sub-zone separates the metal portion from the portion made of synthetic material.

* * * * *